United States Patent
Kim

(10) Patent No.: US 8,610,203 B2
(45) Date of Patent: Dec. 17, 2013

(54) SEMICONDUCTOR DEVICE WITH BURIED GATES

(75) Inventor: Kyung Do Kim, Seoul (KR)

(73) Assignee: Hynix Semiconductor Inc., Icheon (KR)

( * ) Notice: Subject to any disclaimer, the term of this patent is extended or adjusted under 35 U.S.C. 154(b) by 0 days.

(21) Appl. No.: 13/572,136

(22) Filed: Aug. 10, 2012

(65) Prior Publication Data

US 2012/0306008 A1    Dec. 6, 2012

Related U.S. Application Data

(62) Division of application No. 12/846,577, filed on Jul. 29, 2010, now Pat. No. 8,263,460.

(30) Foreign Application Priority Data

Apr. 7, 2010  (KR) .................. 10-2010-0031807

(51) Int. Cl.
   *H01L 29/66*   (2006.01)
(52) U.S. Cl.
   USPC .................. 257/330; 257/E29.262
(58) Field of Classification Search
   CPC ............ H01L 29/7813; H01L 29/4236; H01L 29/0696
   USPC .................. 257/330, 332, E29.262
   See application file for complete search history.

(56) References Cited

U.S. PATENT DOCUMENTS

2007/0173005 A1*  7/2007  Lee ............................. 438/197
2008/0315249 A1*  12/2008  Minato et al. ................. 257/139

FOREIGN PATENT DOCUMENTS

| KR | 1019990080898 A | 11/1999 |
| KR | 1020090123690 A | 12/2009 |
| KR | 1020100004649 A | 1/2010 |

* cited by examiner

*Primary Examiner* — Nikolay Yushin

(57) ABSTRACT

A method for manufacturing a semiconductor device comprises forming a buried gate after forming an active region to have a line type. The buried gate comprises an operation gate and a non-operation gate. A height of a gate electrode layer (conductive material) of the non-operation gate is formed to be lower than that of a gate electrode layer of the operation gate, thereby increasing a threshold voltage and preventing an overlap of the ion-implanted active region with the non-operation gate. As a result, a Gate Induced Drain Leakage (GIDL) is prevented to improve a refresh characteristic of the semiconductor device.

4 Claims, 3 Drawing Sheets

SEMICONDUCTOR DEVICE WITH BURIED GATES

CROSS-REFERENCE TO RELATED APPLICATION

The present application is a divisional of U.S. patent application Ser. No. 12/846,577, filed on Jul. 29, 2010, which claims priority to Korean patent application No. 10-2010-0031807 filed on Apr. 7, 2010, which are incorporated by reference in their entirety.

BACKGROUND OF THE INVENTION

The present invention relates to a semiconductor device and a method for manufacturing the same that prevents a Gate Induced Drain Leakage (GIDL) to improve a refresh characteristic of the semiconductor device.

In general, a semiconductor memory device comprises of a plurality of unit cells, each including one capacitor and one transistor. The capacitor is used to temporarily store data, and the transistor is used to transfer data between a bit line and the capacitor according to a control signal (word line) using the characteristics of a semiconductor changing an electric conductivity according to an environment. The transistor is composed of three regions including a gate, a source, and a drain. Charge transfer occurs between the source and the drain according to a control signal input to the gate. The charge transfer between the source and the drain is achieved through a channel region using the characteristics of the semiconductor.

To form a transistor on a semiconductor substrate, a gate is formed on the semiconductor substrate and impurities are doped on both sides of the gate to form a source and a drain. In order to increase the data storage capacity of the semiconductor memory device, the size of unit cells needs to be reduced. As the design rule of the capacitor and the transistor comprising the unit cell is decreased, the channel length of a cell transistor becomes gradually reduced. This results in a short channel effect and Drain Induced Barrier Lower (DIBL) occurs, thereby deteriorating the reliability of the transistor characteristics. A phenomena occurring due to the reduction in the channel length can be solved by maintaining a threshold voltage so that the cell transistor may perform a normal operation. In general, the shorter the transistor channel, the larger a doping density of impurities is needed in a channel formation region.

However, when the design rule is reduced to less than 100 nm, a doping density of impurities in a channel formation region would need to be increased correspondingly. This increases an electric field in a storage node (SN) junction, thereby deteriorating a refresh characteristic of the semiconductor memory device. To prevent the refresh characteristic, a cell transistor having a three dimensional channel structure is used in which a channel is formed in a vertical direction so that a channel length of a transistor can be maintain in spite of a reduction of the design rule. Namely, although a channel dimension in a horizontal direction is short, the doping density can be reduced since the overall channel length is increased by providing a vertical dimension to the channel, thereby preventing the refresh characteristic from being deteriorated.

In addition, with the higher integration of a semiconductor device, there is a shorter distance between a word line and a bit line connected to a cell transistor. As a result, parasitic capacitance is increased to deteriorate an operation margin of a sense amplifier amplifying data transferred through the bit line. This has a bad influence upon the operation reliability of a semiconductor device. A buried word line structure has been proposed to reduce the parasitic capacitance between a bit line and a word line. In this case, in the buried word line structure, the word line is formed within a recess formed on a semiconductor substrate instead of on a surface the substrate. In the buried word line structure, a conductive material is formed in the recess formed in the semiconductor substrate, and an upper portion of the conductive material is covered with an insulating layer to bury the word line in the semiconductor substrate. Accordingly, electric isolation with the bit line formed on the semiconductor substrate on which source/drain are disposed can be clearly achieved.

However, in the buried word line structure, a Gate Induced Drain Leakage (GIDL) characteristic of the semiconductor device between an N-type junction of an active region and a conductive material (gate electrode) is magnified, thereby deteriorating a refresh characteristic of the semiconductor device.

BRIEF SUMMARY OF THE INVENTION

Various embodiments of the invention are directed to providing a method for manufacturing a semiconductor device that comprises forming a buried gate after forming an active region to have a line type. The buried gate comprises an operation gate and a non-operation gate. A height of a gate electrode layer (conductive material) of the non-operation gate is formed to be lower than that of a gate electrode layer of the operation gate, thereby increasing a threshold voltage and preventing an overlap of the ion-implanted active region with the non-operation gate. As a result, a Gate Induced Drain Leakage (GIDL) is prevented to improve a refresh characteristic of the semiconductor device.

According to an embodiment of the present invention, a method for manufacturing a semiconductor device comprises: forming a device isolation region that defines an active region in a semiconductor substrate; etching the semiconductor substrate with a gate mask as an etching mask to form a gate region; depositing a conductive material on the gate region to form a buried gate including an operation gate and a non-operation gate; first etching the conductive material of the non-operation gate; second etching the conductive material of the operation gate and the non-operation gate; and depositing an insulating film on the semiconductor substrate.

The active region is formed to have a line type.

The conductive material includes polysilicon, aluminum (Al), tungsten (W), tungsten nitride (WN), titanium (Ti), titanium nitride (TiN) and a deposition structure including titanium nitride (TiN) and tungsten (W).

The forming-a-gate-region includes performing an anisotropic process on the semiconductor substrate.

The first and second etching processes of the conductive material are performed by an anisotropic process on the conductive material.

After depositing the insulating film, the method further comprises performing a chemical mechanical polishing (CMP) on the insulating film to expose the active region.

The operation gate and the non-operation gate are formed to have a line type.

The height of the conductive material buried in the non-operation gate is formed to be lower than that of the conductive material buried in the operation gate.

The method further comprises ion-implanting N-type impurities into the active region to form an N-type junction between forming the device isolation region and forming the gate region.

According to another embodiment of the present invention, a method for manufacturing a semiconductor device comprises: forming a device isolation region that defines an active region having a line type in a semiconductor substrate; etching the semiconductor substrate with a gate mask as an etching mask to form a gate region; depositing a conductive material in the gate region to form a buried gate including an operation gate and a non-operation gate; first etching a conductive material of the operation gate and the non-operation gate; second etching the conductive material of the non-operation gate; and depositing an insulating film on the semiconductor substrate.

The conductive material includes polysilicon, aluminum (Al), tungsten (W), tungsten nitride (WN), titanium (Ti), titanium nitride (TiN) and a deposition structure including titanium nitride (TiN) and tungsten (W).

The forming-a-gate-region includes performing an anisotropic process on the semiconductor substrate.

The first and second etching processes of the conductive material are performed by an anisotropic process on the conductive material.

The operation gate and the non-operation gate are formed to have a line type.

The height of the conductive material buried in the non-operation gate is formed to be lower than that of the conductive material buried in the operation gate.

After depositing the insulating film, the method further comprises performing a chemical mechanical polishing (CMP) on the insulating film to expose the active region.

According to an embodiment of the present invention, a semiconductor device comprises: a device isolation region that defines an active region in a semiconductor substrate; and a buried gate including an operation gate and a non-operation gate formed in the semiconductor substrate. A height of a conductive material buried in the non-operation gate is formed to be lower than that of the conductive material buried in the operation gate.

The active region is formed to have a line type.

The conductive material includes polysilicon, aluminum (Al), tungsten (W), tungsten nitride (WN), titanium (Ti), titanium nitride (TiN) and a deposition structure including titanium nitride (TiN) and tungsten (W).

The operation gate and the non-operation gate are formed to have a line type.

DESCRIPTION OF EMBODIMENTS

The present invention will be described in detail with reference to the attached drawings.

Figure 1:
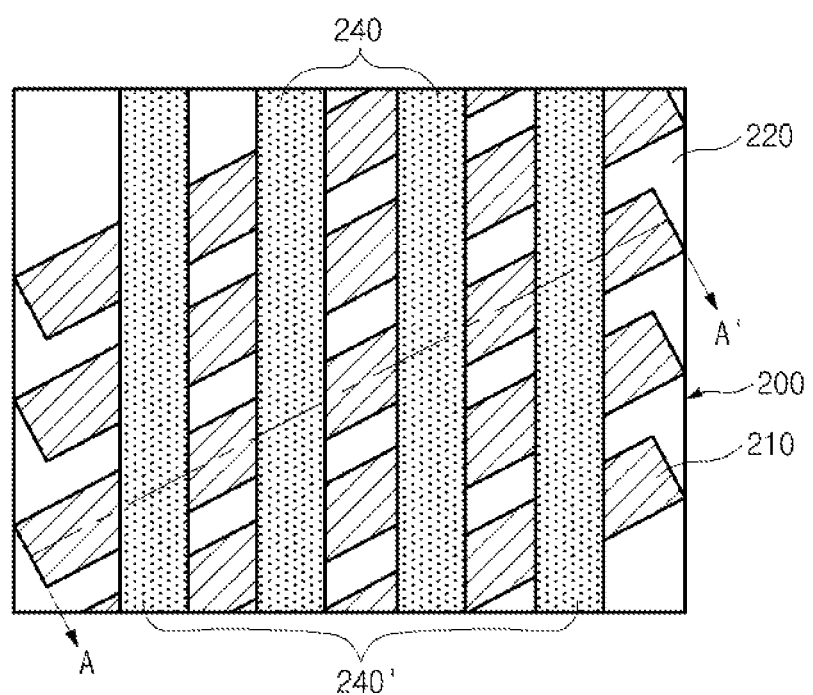
FIG. 1 is a plan view illustrating a semiconductor device and a method for manufacturing the same according to an embodiment of the present invention.

FIG. 1 is a plan view illustrating a semiconductor device and a method for manufacturing the same according to an embodiment of the present invention.

Referring to FIG. 1, a semiconductor substrate 200 includes a device isolation region 220 that defines an active region 210, and buried gates 240, 240' that intersect the active region 210. The active region 210 is formed to have a line type. Buried gates 240, 240' include an operation gate (or active gate) 240 and a non-operation gate (or dummy gate) 240' each of which are formed to have a line type.

Figure 2A:
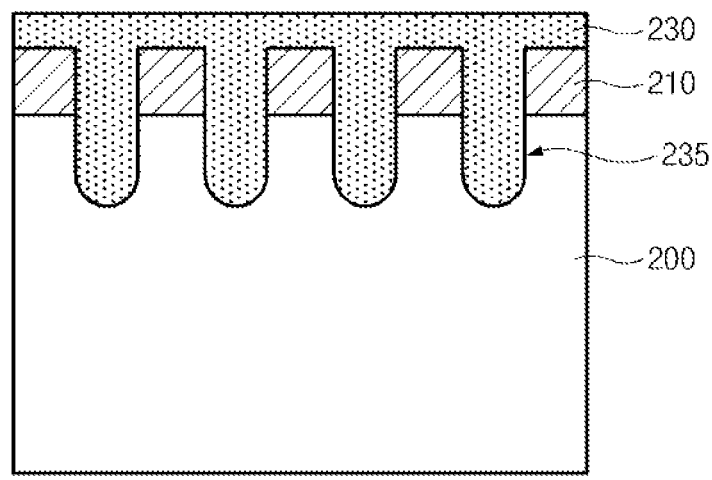
FIGS. 2a to 2c are cross-sectional diagrams illustrating a semiconductor device and a method for manufacturing the same according to an embodiment of the present invention.
Figure 2B:
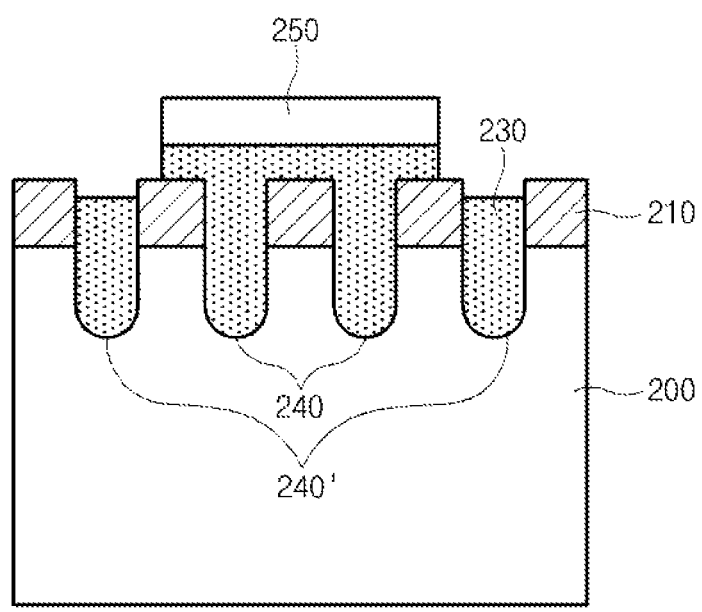
Figure 2C:
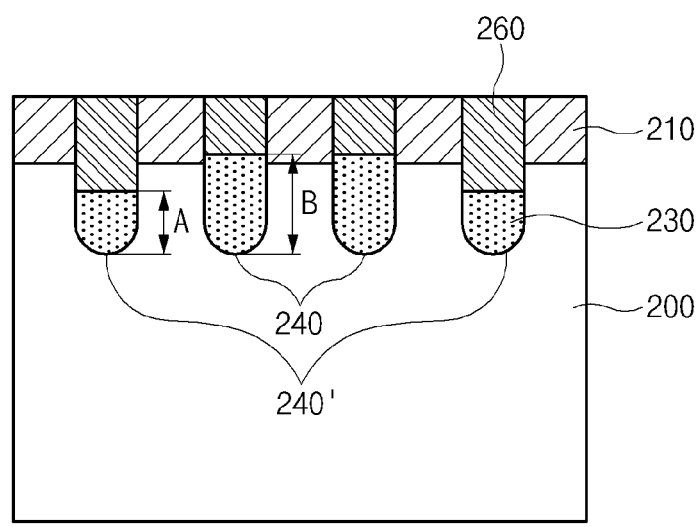

FIGS. 2a to 2c are cross-sectional diagrams taken along A-A' of FIG. 1.

Referring to FIG. 2a, the device isolation region 220 (see FIG. 1) that defines the active region 210 is formed in the semiconductor substrate 200. The active region 210 is formed to have a line type. The device isolation region 220 (see FIG. 1) may be formed by a Shallow Trench Isolation (STI) process. A pad insulating film (not shown) including a pad oxide film and a pad nitride film is deposited on the semiconductor substrate 200. A photoresist film (not shown) is deposited on the pad insulating film, and an exposure process is performed with a mask that defines the active region 210. After the exposed pad insulating film and the semiconductor substrate 200 are etched to form a trench (not shown), a Spin On Dielectric (SOD) material is used to fill the trench. A Chemical Mechanical Polishing (CMP) process is performed to expose the pad insulating film, thereby forming the device isolation region 220.

After the device isolation region 220 has been formed, an N-type impurity is implanted onto the exposed active region 210. An interlayer insulating film (not shown) is deposited on the resultant surface including the active region 210.

After a photoresist film (not shown) is formed on the interlayer insulating film, an exposure process is performed with a mask that defines a buried gate to pattern the interlayer insulating film. The active region 210 and the device isolation region 220 are etched with the patterned interlayer insulating film as an etching mask to form a gate region (not shown). An etch process for forming the gate region is performed by an anisotropic process. A gate oxide film (not shown) is deposited on the gate region.

A conductive material 230 is deposited on the resultant surface including the gate region where a gate oxide film is formed, thereby forming a buried gate 235. The conductive material 230 includes polysilicon, aluminum (Al), tungsten (W), tungsten nitride (WN), titanium (Ti), titanium nitride (TiN) or a combination thereof, e.g., a stack including titanium nitride (TiN) and tungsten (W). The buried gate 235 includes an operation gate 240 and a non-operation gate 240' and the buried gate 235 is formed in a line pattern. No isolation process is required between the active regions 210 because a gate voltage is maintained at an off state in the non-operation gate 240'.

Referring to FIG. 2b, the conductive material 230 forming the non-operation gate 240' is first etched with a mask 250 for exposing the non-operation gate 240' as an etching mask. The first etching process is performed by an anisotropic process so as to etch the conductive material 230 at a depth ranging from 100 Å to 500 Å.

Referring to FIG. 2c, after the mask 250 for exposing the non-operation gate 240' is removed, the conductive materials 230 forming the non-operation gate 240' and the operation gate 240 are etched. The secondary etching process is performed by an anisotropic process. Since the conductive material 230 forming the non-operation gate 240' is etched twice by the first and second etching processes, the height of the conductive material 230 of the non-operation gate 240'(A) is lower than that of the conductive material 230 of the operation gate 240(B). The smaller the height of the conductive material 230 forming the non-operation gate 240', the higher a threshold voltage of a cell transistor and the smaller an overlapped area between the conductive material 230 and source/drain regions of the active region 210. Therefore, the Gate Induced Drain Leakage (GIDL) can be counteracted and improve the refresh characteristic of a semiconductor device In an embodiment, the order of the first and second etch processes can be reversed. That is, the first etch process performed on the conductive material 230 of the non-operation gate 240' can be performed after the second etch process is performed on the conductive material 230 of the operation gate 240 and the non-operation gate 240' according to implementation.

An insulating material 260 is deposited on the resultant structure including the operation gate 240 and the non-operation gate 240'. The insulating material 260 includes any of a SOD film, a Spin On Carbon (SOC) and $SiO_2$. Thereafter, a CMP process is performed to expose the active region 210.

As described above, the present invention includes forming a buried gate after forming an active region to have a line type. The buried gate includes an operation gate and a non-operation gate. A height of a gate electrode layer (conductive material) of the non-operation gate is formed to be lower than that of a gate electrode layer of the operation gate, thereby increasing a threshold voltage and preventing an overlap of the ion-implanted active region with the non-operation gate. As a result, a Gate Induced Drain Leakage (GIDL) is prevented to improve a refresh characteristic of the semiconductor device.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
   a device isolation region that defines an active region in a semiconductor substrate;
   an active gate formed within a first recess of the semiconductor substrate; and
   a dummy gate formed to be lower than a surface of the semiconductor substrate and formed within a second recess of the semiconductor substrate,
   wherein a height of a conductive material of the dummy gate is lower than that of the active gate.

2. The semiconductor device according to claim 1, wherein the active region has a line pattern.

3. The semiconductor device according to claim 1, wherein the conductive material includes any of polysilicon, aluminum (Al), tungsten (W), tungsten nitride (WN), titanium (Ti), titanium nitride (TiN) and a combination thereof.

4. The semiconductor device according to claim 1, wherein the active gate and the dummy gate have a line pattern.

* * * * *